(12) United States Patent
Frenzel et al.

(10) Patent No.: US 11,470,736 B2
(45) Date of Patent: Oct. 11, 2022

(54) POTTED ELECTRONIC MODULE WITH IMPROVED ADHESION OF POTTING COMPOUND

(71) Applicants: Continental Teves AG & Co. OHG, Frankfurt am Main (DE); Continental Automotive GmbH, Hannover (DE)

(72) Inventors: Henryk Frenzel, Regensburg (DE); Dietmar Huber, Roedermark (DE); Jakob Schillinger, Gaimersheim (DE); Jörg Möstl, Mainhausen (DE); Karl-Heinz Scherf, Eppstein (DE); Georg Weber, Egelsbach (DE)

(73) Assignee: Continental Automotive GmbH, Hannover (DE)

( * ) Notice: Subject to any disclaimer, the term of this patent is extended or adjusted under 35 U.S.C. 154(b) by 1021 days.

(21) Appl. No.: 16/172,135

(22) Filed: Oct. 26, 2018

(65) Prior Publication Data

US 2019/0075670 A1 Mar. 7, 2019

Related U.S. Application Data

(62) Division of application No. 15/038,802, filed as application No. PCT/EP2015/053447 on Feb. 18, 2015, now Pat. No. 10,136,533.

(30) Foreign Application Priority Data

Feb. 18, 2014 (DE) ...................... 10 2014 202 978.3

(51) Int. Cl.
*H05K 5/02* (2006.01)
*H05K 5/00* (2006.01)
(Continued)

(52) U.S. Cl.
CPC .......... *H05K 5/0247* (2013.01); *H05K 5/0056* (2013.01); *H05K 13/00* (2013.01); *G01R 31/364* (2019.01); *Y10T 29/49146* (2015.01)

(58) Field of Classification Search
CPC ........................... H05K 5/0247; H05K 5/0056
See application file for complete search history.

(56) References Cited

U.S. PATENT DOCUMENTS 4,513,352 A * 4/1985 Bennett .............. H05K 7/20336
165/902
4,546,412 A 10/1985 Nakazawa et al.
(Continued)

FOREIGN PATENT DOCUMENTS

DE 102007034757 2/2008
DE 102011086048 10/2012
(Continued)

OTHER PUBLICATIONS

International Search Report of the International Searching Authority for International Application PCT/EP2015/053447, dated May 12, 2015, 3 pages, European Patent Office, HV Rijswijk, Netherlands.
(Continued)

*Primary Examiner* — Adrian S Wilson
(74) *Attorney, Agent, or Firm* — RatnerPrestia

(57) ABSTRACT

A potted electronic module includes an electronic assembly with a conductor such as a shunt that is arranged in a housing, and includes an electrical contact guided out through the housing wall, and a potting compound within the housing. The module may be produced by removing a protective layer from an area of the conductor by ablation, and then introducing a potting or casting compound into the housing, so that the potting compound covers a location at which the electrical contact passes through the housing wall, and the potting compound adheres directly onto the exposed
(Continued)

conductor at the area at which the protective layer was removed.

22 Claims, 2 Drawing Sheets

(51) Int. Cl.
*H05K 13/00* (2006.01)
*G01R 31/364* (2019.01)

(56) References Cited

U.S. PATENT DOCUMENTS

| | | | | |
|---|---|---|---|---|
| 4,685,402 | A * | 8/1987 | Nelson | E05G 1/024 |
| | | | | 312/409 |
| 5,069,358 | A * | 12/1991 | Avery, Jr. | G11B 33/04 |
| | | | | 29/469 |
| 5,096,427 | A * | 3/1992 | Sadigh-Behzadi | H05K 5/0069 |
| | | | | 361/759 |
| 5,438,162 | A * | 8/1995 | Thompson | H05K 7/1417 |
| | | | | 174/547 |
| 5,750,925 | A * | 5/1998 | Purdom | H05K 5/0213 |
| | | | | 174/544 |
| 5,756,934 | A * | 5/1998 | Purdom | H05K 5/0213 |
| | | | | 174/544 |
| 5,810,919 | A * | 9/1998 | Olzak | C08L 91/06 |
| | | | | 346/25 |
| 6,158,833 | A * | 12/2000 | Engler | G11B 33/02 |
| | | | | 312/409 |
| 6,299,950 | B1 * | 10/2001 | Byington | G21F 5/10 |
| | | | | 376/323 |
| 6,434,000 | B1 * | 8/2002 | Pandolfi | F25B 23/006 |
| 7,002,807 | B2 | 2/2006 | Takabatake et al. | |
| 7,211,742 | B2 * | 5/2007 | Moore | H05K 5/0213 |
| 7,399,719 | B2 * | 7/2008 | Hanan | H05K 5/0213 |
| | | | | 521/123 |
| 7,573,274 | B2 | 8/2009 | Aratani | |
| 7,843,689 | B2 * | 11/2010 | Moore | G06F 1/20 |
| | | | | 312/409 |
| 7,916,487 | B2 * | 3/2011 | Bitton | G11B 33/1406 |
| | | | | 361/679.02 |
| 9,622,372 | B2 * | 4/2017 | Schillinger | H05K 7/14 |
| 10,136,533 | B2 * | 11/2018 | Frenzel | H05K 5/0056 |
| 2004/0064631 | A1 * | 4/2004 | Kishon | G11B 33/1406 |
| | | | | 711/100 |
| 2004/0070926 | A1 * | 4/2004 | Boykin | H05K 7/14 |
| 2004/0236988 | A1 * | 11/2004 | Sastrel | G11B 33/1426 |
| | | | | 714/13 |
| 2005/0057849 | A1 * | 3/2005 | Twogood | G11B 33/022 |
| | | | | 360/97.12 |
| 2005/0068666 | A1 * | 3/2005 | Albrecht | G11B 33/1466 |
| | | | | 360/99.18 |
| 2008/0175983 | A1 * | 7/2008 | Moore | G11B 33/1453 |
| | | | | 528/403 |
| 2008/0310096 | A1 * | 12/2008 | Sandesara | G11B 33/14 |
| | | | | 361/679.34 |
| 2009/0050365 | A1 * | 2/2009 | Moore | G11B 33/142 |
| | | | | 174/547 |
| 2011/0017747 | A1 * | 1/2011 | Wildman | B29D 22/003 |
| | | | | 220/560.01 |
| 2014/0027172 | A1 | 1/2014 | Schillinger et al. | |
| 2014/0347819 | A1 | 11/2014 | Ott | |
| 2015/0173227 | A1 * | 6/2015 | Ott | H05K 5/065 |
| | | | | 29/829 |

FOREIGN PATENT DOCUMENTS

| | | |
|---|---|---|
| DE | 102011089474 | 6/2013 |
| JP | 2002-280512 A | 9/2002 |
| WO | WO 2014/023457 | 2/2014 |

OTHER PUBLICATIONS

PCT International Preliminary Report on Patentability including English Translation of PCT Written Opinion of the International Searching Authority for International Application PCT/EP2015/053447, dated Aug. 23, 2016, 18 pages, International Bureau of WIPO, Geneva, Switzerland.

* cited by examiner

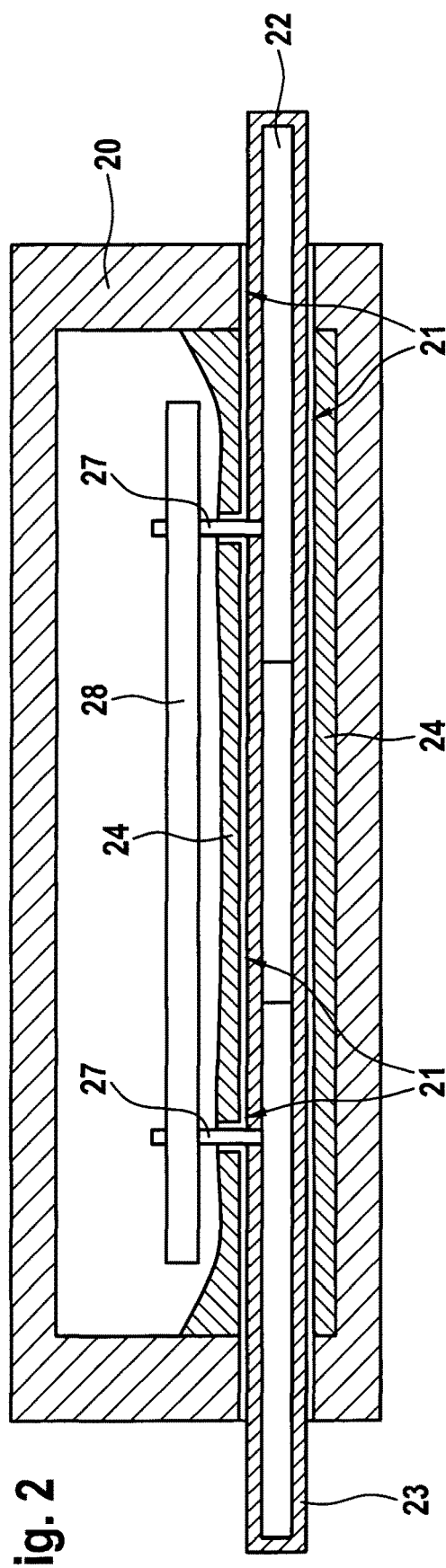
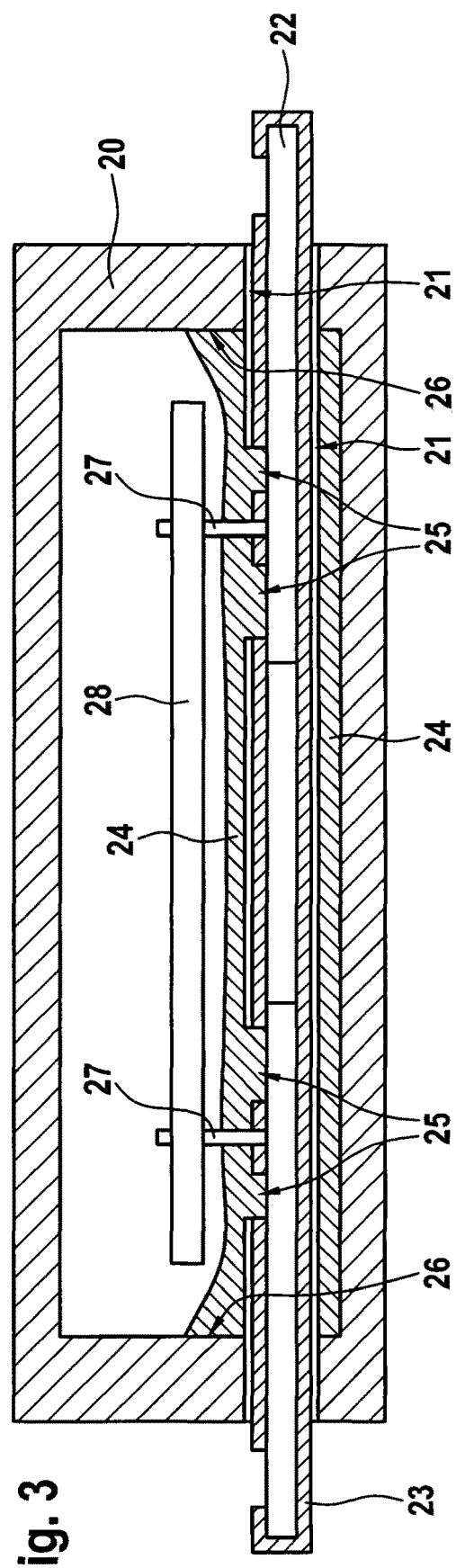

POTTED ELECTRONIC MODULE WITH IMPROVED ADHESION OF POTTING COMPOUND

CROSS-REFERENCE TO RELATED APPLICATIONS

This application is a Divisional of U.S. patent application Ser. No. 15/038,802 filed on May 24, 2016, which was a 35 USC 371 National Stage of PCT International Application PCT/EP2015/053447 filed on Feb. 18, 2015, and claims the foreign priority of German Patent Application DE 10 2014 202 978.3 filed on Feb. 18, 2014. The entire disclosures of all of the prior related applications are incorporated herein by reference.

FIELD OF THE INVENTION

The invention relates to a potted electronic module with improved adhesion of a potting compound of the module, and to a method by which such a potted electronic module may be produced.

BACKGROUND INFORMATION

In the prior art, it is known to surround an electrical assembly with a housing for the purpose of protecting against mechanical damage and also against environmental influences. It is likewise known to partially or completely fill the interior space in the housing in which the assembly is arranged with a casting compound (also known as a potting compound) in order to provide yet further protection. Finally, it is also known to surround the assembly, which can comprise an electrical conductor, for example a so-called shunt or a terminal of a plug, for example, with a protective layer, so that the assembly is even more effectively shielded against environmental influences. It is also often the case that only the conductor is surrounded by the protective layer. In this case, the protective layer serves to prevent oxidation or corrosion of the conductor surface and is furthermore necessary to prevent other negative effects which are known to a person skilled in the art in this regard.

Reliable connection of the casting or potting compound to the housing, whereby the connection provides reliable shielding against environmental influences and, respectively, must therefore be tight, is usually ensured. Owing to plasma activation of the housing, which is known to a person skilled in the art, said connection can even be further improved for certain material combinations of the housing and the potting compound. A tight connection between the potting compound and different metals is likewise usually ensured.

However, one common problem which occurs in this regard is that the potting compound forms only inadequate connection with said protective layer, so that the connection between the conductor and the potting compound is broken in the event of changes in temperature or under the action of certain environmental media or environmental influences, this leading to the overall protective effect being adversely affected. By way of example, different types of contamination, for example water, can enter the housing through the gap which is produced between the protective layer and the potting compound and adversely affect the functioning of the assembly or destroy the assembly.

SUMMARY OF THE INVENTION

In view of the above, it is an object of at least one embodiment of the invention to achieve an improved adhesion of the potting compound to an electrical assembly or component, such as a shunt or other conductor, in the potted electronic module. It is also an object of at least one embodiment of the invention to avoid the disadvantages which arise in the prior art due to the comparatively poor connection between the casting or potting compound and the protective layer. One or more of the embodiments of the invention further aim to avoid or overcome disadvantages of the prior art, and to achieve additional advantages, as apparent from the present specification. The attainment of these objects is, however, not a required limitation of claimed embodiments of the invention.

The above objects can be achieved in a potted electronic module, and by carrying out a method of producing a potted electronic module, according to respective embodiments of the invention.

It is preferred to partially remove the protective layer and/or other layer fully or partially from metallic points of the assembly or of the conductor or of the shunt before filling the housing with the potting compound. Since the metal beneath the protective layer is therefore exposed, the potting compound can form a reliable connection with the metal.

The term 'layer' in one aspect is understood to refer to a layer of a material different from the underlying conductor material, which is applied on the underlying conductor material. In another aspect, the term 'layer' is understood to mean a surface material of the conductor or shunt itself, wherein this surface material is, in particular, different from the main material of the conductor or shunt and therefore forms a protective layer or another additional, separate layer, or wherein said surface material is, in particular, the same material as or integral material with the conductor or shunt and it is only the surface material with a defined surface extent and defined thickness which is removed, for example by laser ablation.

By virtue of removing the layer and/or protective layer, the surface of the conductor or shunt which is exposed or locally exposed as a result is expediently activated or chemically activated or the roughness of said exposed surface is increased. It is particularly preferred that the exposed surface of the conductor or shunt is oxidized, at least partially, by the removal of the layer and/or protective layer.

It is preferred that the layer, which is removed, of the at least one assembly is a protective layer.

It is preferred that the assembly comprises an electrical conductor, in particular in the form of a shunt, from which the layer is removed.

It is expedient that the electrical conductor, in particular in the form of a shunt, comprises the electrical contacts which are routed through the housing wall.

The layer or protective layer is preferably removed by means of ablation. In this case, the ablation is performed or carried out, in particular, by means of laser light and/or electrical energy, in particular electric current.

It is expedient that the ablation is performed as part of a joining process of the at least one assembly. In this case, the electrical conductor or shunt is, in particular, inserted into the housing or the housing is injection-molded and formed onto or around the shunt/conductor, wherein the electrical contacts of the conductor or shunt are routed through the housing wall, after which the ablation or removal of the layer is carried out at at least one point.

It is preferred that the layer or protective layer of the at least one assembly is removed from the conductor in the region of press-in connector pins which connect a conductor of the assembly to at least one assembly element, in particular in the respective region of a plurality of press-in connector pins.

It is expedient, in particular additionally, that the layer or protective layer of the at least one assembly is removed, in particular, from the conductor which comprises the electrical contacts, which are routed through the housing wall, in the region of said electrical contacts outside the housing.

Assembly elements or the electronics are preferably connected to the electrical conductor by means of press-in connector pins which are fastened on the conductor. Possible connection techniques include soldering, adhesive bonding, sintering, welding and other techniques which are known to a person skilled in the art in this regard.

The energy for welding the connector pins and/or for removing the layer or protective layer is preferably input either using laser light or using electric current.

The process of fastening the assembly elements or the electronics to the electrical conductor by means of the press-in connector pins is expediently used for the purpose of removing, for example by means of ablation, the protective layer in the region of the press-in connector pins by means of said input of energy using laser light or using electric current.

The layer or protective layer is preferably removed in such a way that a complete, closed surface is exposed without islands of protective layer remaining in the surface, or that a circumferential ring around one or more remaining islands of protective layer in the surface is exposed.

Therefore, only one single processing system (for example laser system or electricity system) or a single fixing process is necessary for connecting the potting compound to the assembly or to the conductor and for removing the protective layer.

The additional time required for removing the protective layer or for the ablation is negligibly low in this case.

The protective layer is preferably removed not only in the region of the press-in connector pins but, as an alternative or in addition, also in the region of an external contact-making zone or in the region of external plugs.

The electronic module is preferably developed such that the assembly comprises at least one electrical conductor and at least one assembly element, wherein the layer which is removed is removed from the conductor.

It is preferred that the layer, which is removed, of the at least one assembly is a protective layer.

It is expedient that the assembly element is an electronic circuit and/or an electronic arithmetic and logic unit.

It is preferred that the electrical conductor, in particular in the form of a shunt, comprises the electrical contacts which are routed through the housing wall.

The at least one assembly element and the at least one conductor are preferably electrically and mechanically connected to one another by means of press-in connector pins.

It is preferred that the potting compound covers the at least one conductor, at least within the housing.

It is expedient that the at least one assembly element is arranged in the housing outside the potting compound.

The electronic module is preferably designed such that the layer or protective layer of the at least one assembly is removed from the conductor in the region of the press-in connector pins.

It is preferred that the layer or protective layer of the at least one assembly is removed from the conductor in the region of the electrical contacts outside the housing.

The electronic module is preferably in the form of a battery sensor or in the form of part of a battery sensor, in particular for motor vehicles. To this end, said battery sensor expediently comprises a battery terminal for connection and for fastening to the pole of a vehicle battery.

BRIEF DESCRIPTION OF THE DRAWINGS

Further preferred features of embodiments of the invention can be found in the following description of exemplary embodiments, with reference to the accompanying drawings, in which:

FIG. 3 shows, schematically and by way of example, an electronic assembly which is surrounded by a housing and has diffusion channels which are interrupted according to the invention.

DETAILED DESCRIPTION OF EXAMPLE EMBODIMENTS OF THE INVENTION

Figure 1A:
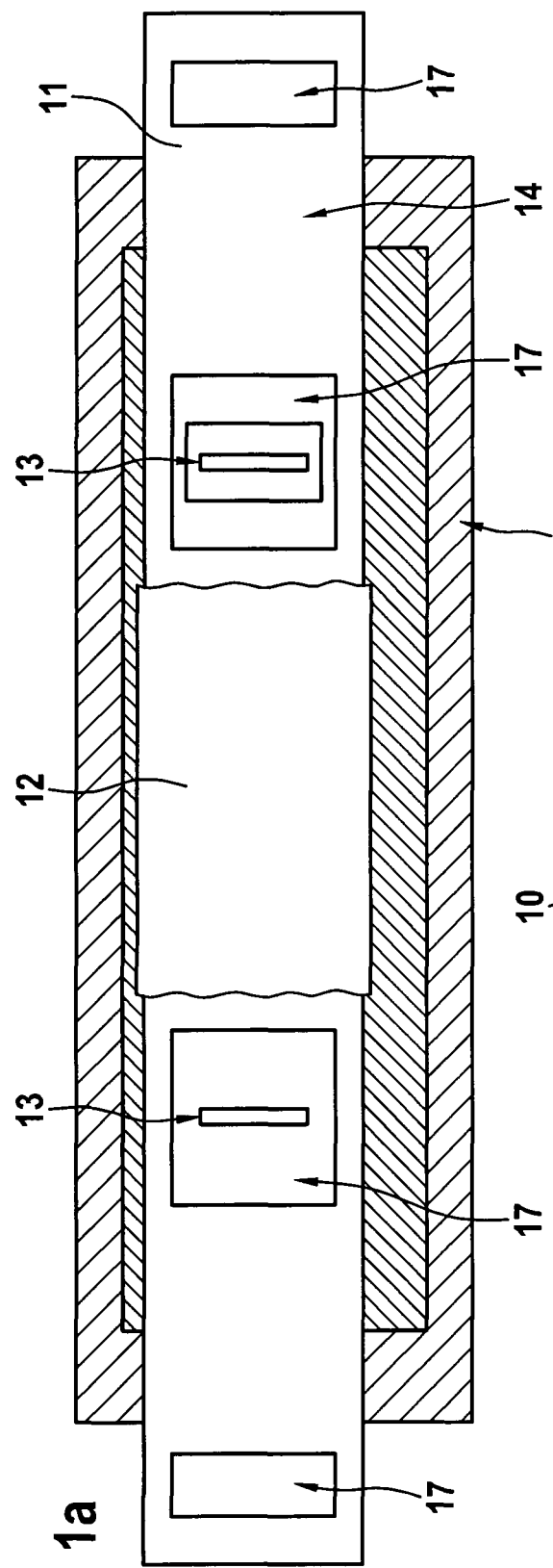
FIG. 1a shows, schematically and by way of example, a sectional top view of an electronic assembly which is surrounded by a housing.
Figure 1B:
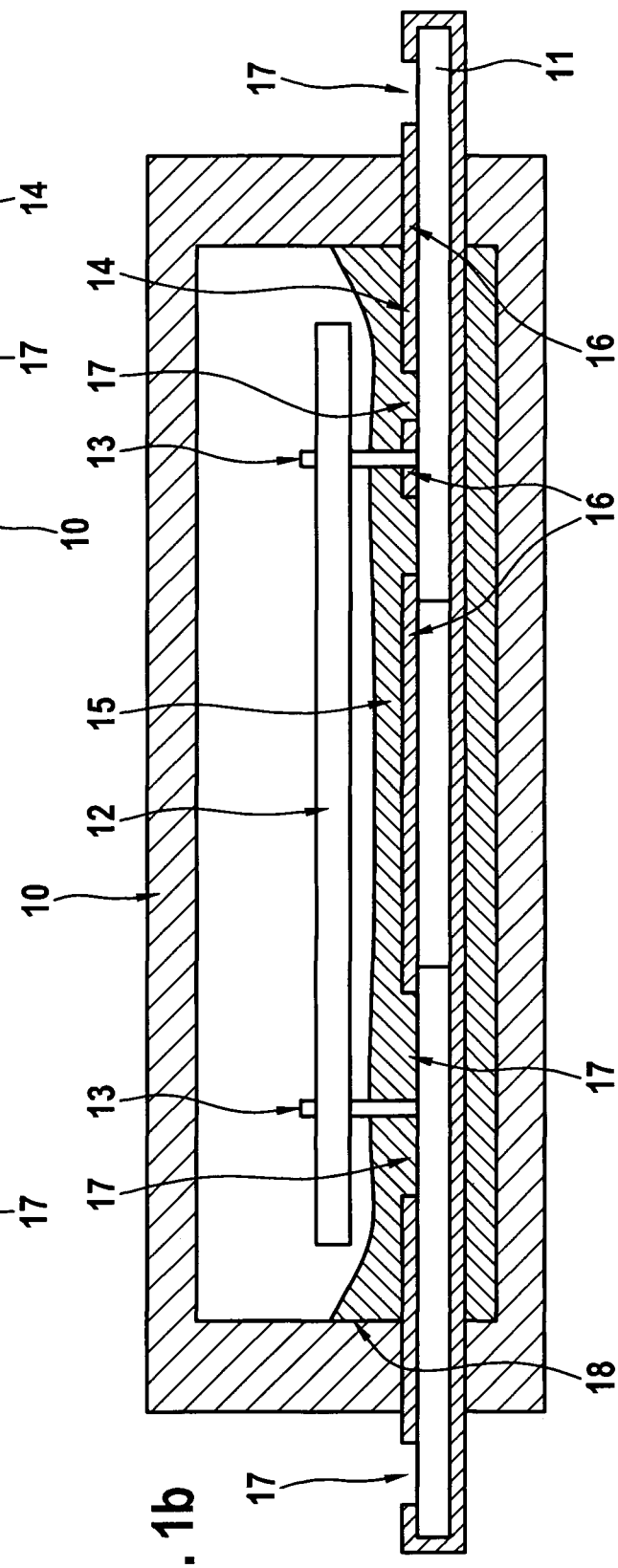
FIG. 1b shows a sectional side view of the arrangement of FIG. 1a, FIG. 2 schematically shows a comparative example of an electronic assembly (not according to the present invention), which is surrounded by a housing and has diffusion channels through which contamination may enter.

FIG. 1 shows an electronic assembly, which comprises conductor 11 and assembly element 12, and which is surrounded by housing 10. FIG. 1a shows an illustration from above, whereas FIG. 1b shows a side view. Conductor 11 and assembly element 12 are electrically and mechanically connected to one another by means of press-in connector pins 13. Conductor 11 is also surrounded or encased by protective layer 14 and encapsulated by potting or casting compound 15. Potting compound 15 covers conductor 11 in housing 10 in such a way that only press-in connector pins 13 project through and out of the potting compound 15. Potting compound 15 is connected to protective layer 14 at locations or areas 16, this however leading to an only weak and unreliable connection owing to the material properties of potting compound and protective layer 14 according to the example. At locations or areas 17 however, protective layer 14 has been removed from conductor 11, so that the metallic material of conductor 11 is revealed or exposed at locations or areas 17. There is therefore a tight and reliable connection between potting compound 15 and conductor 11 at locations or areas 17 for example. A good and reliable connection is likewise produced at area 18, in this case between housing 10 and potting compound 15.

FIG. 2 shows a comparative example of a non-inventive electronic assembly which is surrounded by housing 20 and, because it has not been produced according to the improved method of the present invention, has continuous diffusion channels 21 through which different types of contamination can enter housing 20 and can damage or destroy the assembly. Examples of contamination which can enter through diffusion channels 21 include water and salts. In this case, diffusion channels 21 are produced, for example, by conductor 22, which is surrounded by protective layer 23, not sealing tightly to housing 20 and furthermore protective layer not sealing tightly to potting compound 24. Therefore, contamination can penetrate as far as press-in connector pins 27 and further along said press-in connector pins as far as assembly element 28 which can be damaged or destroyed by said contamination.

FIG. 3 shows an electronic assembly which is surrounded by housing 20 and has diffusion channels 21 which are interrupted according to the invention. Since conductor 22 does not have a protective layer 23 at locations or areas 25 (because the protective layer 23 has been removed at the areas 25 according to the invention), therefore a tight and reliable connection between conductor 22 and potting compound 24 is produced at areas 25 according to this example embodiment of the invention. Therefore, areas 25 form interruptions in diffusion channels 21 and prevent contamination, such as water or salts for example, from reaching press-in connector pins 27 and corroding said connector pins. There is a likewise a tight and reliable connection between housing 20 and potting compound 24 at areas 26, so that no contamination can reach assembly element 28 here either.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims. The abstract of the disclosure does not define or limit the claimed invention, but rather merely abstracts certain features disclosed in the application.

What is claimed is:

1. An electronic module,
comprising a housing, an electronic assembly arranged at least partially in an interior space in the housing, and a potting compound at least partly filling a remainder of the interior space in the housing,
wherein the electronic assembly includes electrical contacts that are routed through passage points in a housing wall of the housing, out of the interior space in the housing, to outside of the housing,
wherein the potting compound covers the passage points in the housing wall at which the electrical contacts are routed through the housing wall, and
wherein a layer of the assembly has been removed to expose a metal conductor material of the assembly at an exposed area, and the potting compound adheres directly onto the metal conductor material at the exposed area.

2. The electronic module according to claim 1, wherein the layer that is removed is a protective layer.

3. The electronic module according to claim 1, wherein the electronic assembly comprises an electrical conductor and an electronic element, wherein the layer is removed from the electrical conductor.

4. The electronic module according to claim 3, wherein the electrical conductor is a shunt conductor that includes the electrical contacts that are routed through the housing wall.

5. The electronic module according to claim 3, wherein the potting compound covers the electrical conductor, at least within the housing.

6. The electronic module according to claim 3, wherein the electronic element is arranged in the housing outside of the potting compound.

7. The electronic module according to claim 3, wherein the layer is removed from the electrical conductor in an area of press-in connector pins of the electronic element.

8. The electronic module according to claim 3, wherein the layer is removed from the electrical conductor in the area of the electrical contacts outside the housing.

9. An electronic module, wherein:
the electronic module comprises a housing, an electronic assembly that is arranged at least partially within an interior space in the housing, and a potting compound that at least partially fills a remainder of the interior space in the housing;
the electronic assembly includes an electronic component and an electrical conductor connected to the electronic component;
the electrical conductor includes an electrically conductive conductor core and a protective layer on the conductor core;
the electrical conductor includes at least one electrical contact that extends to outside of the housing through at least one passage provided in a housing wall of the housing;
a portion of a surface of the conductor core at an exposed area thereof is devoid of and not covered by the protective layer;
the potting compound covers the at least one passage where the at least one electrical contact passes through the housing wall from the interior space to the outside of the housing; and
the potting compound covers and adheres directly onto the surface of the conductor core at the exposed area thereof.

10. The electronic module according to claim 9, wherein the exposed area of the surface of the conductor core has an increased adhesion with respect to the potting compound because the exposed area of the surface of the conductor core has an increased surface roughness compared to a covered area of the surface of the conductor core that is covered by the protective layer.

11. The electronic module according to claim 9, wherein the exposed area of the surface of the conductor core has an increased adhesion with respect to the potting compound because the exposed area of the surface of the conductor core is chemically activated compared to a covered area of the surface of the conductor core that is covered by the protective layer.

12. The electronic module according to claim 9, wherein the exposed area of the surface of the conductor core has an increased adhesion with respect to the potting compound because the exposed area of the surface of the conductor core is oxidized compared to a covered area of the surface of the conductor core that is covered by the protective layer.

13. The electronic module according to claim 9, wherein the protective layer is an outer surface layer on the conductor core, and comprises a same material as, or an integral material with, the conductor core.

14. The electronic module according to claim 9, wherein the protective layer is an additional layer applied on the conductor core, and is made of a protective material different from a conductor material of the conductor core.

15. The electronic module according to claim 9, wherein:
the at least one passage includes two passages through the housing wall,
the at least one electrical contact includes two electrical contacts of the electrical conductor that respectively extend through the two passages,
the electrical conductor comprises an electrical current shunt, and
the two electrical contacts are provided respectively at two ends of the electrical current shunt.

16. The electronic module according to claim 9, wherein:
the electronic assembly further includes an electrical connector pin that connects the electrical conductor to the electronic component, wherein the electrical connector pin is electrically and mechanically connected directly to and extends perpendicularly from the conductor core, and is electrically and mechanically connected to the electronic component; and the exposed area of the surface of the conductor core onto which the potting compound adheres is located directly adjoining the connector pin where the connector pin is connected directly to the conductor core.

17. The electronic module according to claim 16, wherein:

the exposed area of the surface of the conductor core forms a continuous perimeter ring extending entirely, continuously and directly around a perimeter of the connector pin on the conductor core; and the potting compound adhering directly onto the surface of the conductor core at the exposed area forms a continuous perimeter seal around the connector pin where the connector pin is connected directly to the conductor core.

18. The electronic module according to claim 9, wherein:

the electronic assembly further includes an electrical connector pin that connects the electrical conductor to the electronic component, wherein the electrical connector pin is electrically and mechanically connected directly to and extends perpendicularly from the conductor core, and is electrically and mechanically connected to the electronic component; and the exposed area of the surface of the conductor core onto which the potting compound adheres is located adjacently spaced apart from the connector pin where the connector pin is connected directly to the conductor core.

19. The electronic module according to claim 18, wherein:

an island of the protective layer remains around the connector pin where the connector pin is connected directly to the conductor core;

the exposed area of the surface of the conductor core forms a continuous perimeter ring extending entirely continuously around a perimeter of the island of the protective layer around the connector pin on the conductor core; and the potting compound adhering directly onto the surface of the conductor core at the exposed area forms a continuous perimeter seal around the island of the protective layer and the connector pin.

20. The electronic module according to claim 9, wherein the potting compound covers the electrical conductor in the interior space in the housing, and the electronic component remains free and uncovered by the potting compound and exposed to a void in the interior space.

21. The electronic module according to claim 9, wherein:

the electronic assembly further includes an electrical connector pin that connects the electrical conductor to the electronic component, wherein the electrical connector pin is electrically and mechanically connected directly to the conductor core and the electronic component; and the exposed area is located and configured so that the potting compound adhered directly onto the surface of the conductor core at the exposed area interrupts and seals a diffusion channel which penetrates from outside of the housing into and through the passage between the protective layer of the electrical conductor and the housing wall in the passage, and prevents the diffusion channel from progressing to the electrical connector pin where the electrical connector pin is connected directly to the conductor core.

22. The electronic module according to claim 9, wherein:

the conductor core of the electrical conductor has a flat rectangular parallelepiped shape;

the surface of the conductor core of which a portion is exposed at the exposed area is a flat planar major surface of the flat rectangular parallelepiped shape;

the electronic assembly further includes an electrical connector pin that connects the electrical conductor to the electronic component, wherein the electrical connector pin is electrically and mechanically connected to the electronic component, and the electrical connector pin is electrically and mechanically connected to and extends perpendicularly from the exposed area on the flat planar major surface of the flat rectangular parallelepiped shape of the conductor core;

the exposed area is limited to only the flat planar major surface, forms a continuous ring extending entirely continuously around the connector pin on the flat planar major, and does not extend entirely around a cross-section of the conductor core; and the potting compound adhering directly onto the flat planar major surface at the exposed area forms a continuous seal around the electrical connector pin on the flat planar major surface of the conductor core.

\* \* \* \* \*

UNITED STATES PATENT AND TRADEMARK OFFICE
CERTIFICATE OF CORRECTION

PATENT NO. : 11,470,736 B2
APPLICATION NO. : 16/172135
DATED : October 11, 2022
INVENTOR(S) : Henryk Frenzel et al.

It is certified that error appears in the above-identified patent and that said Letters Patent is hereby corrected as shown below:

On the Title Page

Assignee should read (73) Assignee: -- Continental Teves AG & Co. oHG, Frankfurt am Main (DE)
Continental Automotive GmbH, Hannover (DE) --.

Signed and Sealed this
Twenty-second Day of November, 2022

Katherine Kelly Vidal
*Director of the United States Patent and Trademark Office*